(12) United States Patent
Choe

(10) Patent No.: US 6,741,101 B1
(45) Date of Patent: May 25, 2004

(54) METHOD FOR CLOCK CONTROL OF CLOCKED HALF-RAIL DIFFERENTIAL LOGIC WITH SINGLE-RAIL LOGIC

(75) Inventor: Swee Yew Choe, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 64 days.

(21) Appl. No.: 10/272,101

(22) Filed: Oct. 15, 2002

(51) Int. Cl.[7] .............................................. H03K 19/096
(52) U.S. Cl. ......................................... 326/95; 326/121
(58) Field of Search ............................ 326/93–98, 112, 326/119, 121

(56) References Cited

U.S. PATENT DOCUMENTS

| | | | |
|---|---|---|---|
| 4,247,791 A | 1/1981 | Rovell | 307/238 |
| 5,859,548 A | 1/1999 | Kong | 326/113 |
| 6,028,454 A | 2/2000 | Elmasry et al. | 326/115 |
| 6,211,704 B1 | 4/2001 | Kong | 326/121 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, vol. 36 No. 5, Mar. 2, 2000, pp. 404 to 405.

Kong et al., "Charge Recycling Differential Logic for Low–Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

*Primary Examiner*—Don Le
(74) *Attorney, Agent, or Firm*—Gunnison, McKay & Hodgson, L.L.P.; Philip J. McKay

(57) ABSTRACT

Clocked half-rail differential logic circuits with single-rail logic of the invention do not include complementary logic elements. According to the invention, the complementary logic function of the prior art is replaced by a single transistor appropriately sized to provide the complementary output OUTBAR. Consequently, clocked half-rail differential logic circuits with single-rail logic of the invention use less power and, therefore, generate less heat, require less space, and are simpler in design so that they are more flexible, more space efficient and more reliable than prior art half-rail differential logic circuits.

18 Claims, 6 Drawing Sheets

METHOD FOR CLOCK CONTROL OF CLOCKED HALF-RAIL DIFFERENTIAL LOGIC WITH SINGLE-RAIL LOGIC

FIELD OF THE INVENTION

The present invention relates generally to logic circuits and, more particularly, to half-rail differential logic circuits.

BACKGROUND OF THE INVENTION

With the emergence of an electronics market that stresses portability, compact size, lightweight and the capability for prolonged remote operation, a demand has arisen for low power circuits and systems. This demand has motivated circuit designers to depart from conventional circuit designs and venture into more power efficient alternatives. As part of this effort, half-rail differential logic has emerged as an important design tool for increasing power efficiency.

FIG. 1A shows a schematic diagram of one embodiment of a clocked half-rail differential logic circuit 100 designed according to the principles of the invention set forth in patent application Ser. No. 09/927,751, entitled "Clocked Half-Rail Differential Logic", filed Aug. 9, 2001, in the name of the present inventor, assigned to the assignee of the present invention, and incorporated herein by reference, in its entirety. As seen in FIG. 1A, a clock signal CLK is coupled to an input node 132 of a clock inverter 134 to yield a clock-not signal CLKBAR at output node 136 of clock inverter 134.

As also seen in FIG. 1A, clocked half-rail differential logic circuit 100 includes a first supply voltage 102 coupled to a source, or first flow electrode 130, of a PFET 101. The signal CLKBAR is coupled to a control electrode or gate 103 of PFET 101 and a control electrode or gate 129 of an NFET 109. A drain, or second flow electrode 104, of PFET 101 is coupled to both a source, or first flow electrode 106, of a PFET 105 and a source, or first flow electrode 108, of a PFET 107. A control electrode or gate 116 of PFET 105 is coupled to a first flow electrode 140 of NFET 109 and an OUTBAR terminal 113. A control electrode or gate 114 of PFET 107 is coupled to a second flow electrode 138 of NFET 109 and an OUT terminal 111. A drain, or second flow electrode 110, of PFET 105 is coupled to OUT terminal 111 and a drain, or second flow electrode 112, of PFET 107 is coupled to OUTBAR terminal 113.

OUT terminal 111 is coupled to a terminal 118 of a base logic portion 123A of a logic block 123 and OUTBAR terminal 113 is coupled to a terminal 120 of a complementary logic portion 123B of logic block 123. Base logic portion 123A of logic block 123 includes any type of differential logic and/or circuitry used in the art including various logic gates, logic devices and circuits. Complementary logic portion 123B of logic block 123 includes any type of complementary differential logic and/or circuitry used in the art including various logic gates, logic devices and circuits. As discussed in more detail below, since clocked half-rail differential logic circuit 100 was a dual rail logic circuit, requiring an output OUT 111 and a complementary output OUTBAR 113, in the prior art, logic block 123 had to include both a base logic portion 123A, such as an AND gate, OR gate, XOR gate, etc. and the complementary logic portion 123B of base logic portion 123A, such as a NAND gate, NOR gate, XNOR gate, etc. Logic block 123 also includes first and second input terminals 151 and 153 that are typically coupled to an OUT and OUTBAR terminal of a previous clocked half-rail differential logic circuit stage (not shown).

Logic block 123 also includes fourth terminal 122 coupled to a drain, or first flow electrode 124, of an NFET 125. A gate or control electrode 127 of NFET 125 is coupled to the signal CLK and a source, or second flow electrode 126, of NFET 125 is coupled to a second supply voltage 128.

A particular embodiment of a clocked half-rail differential logic circuit 100 is shown in FIG. 1A. Those of skill in the art will recognize that clocked half-rail differential logic circuit 100 can be easily modified. For example, different transistors, i.e., first, second and third PFETs 101, 105 and 107 or first and second NFETs 109 and 125 can be used. In particular, the NFETs and PFETS shown in FIG. 1A can be readily exchanged for PFETs and NFETs by reversing the polarities of the supply voltages 102 and 128, or by other well known circuit modifications. Consequently, the clocked half-rail differential logic circuit 100 that is shown in FIG. 1A is simply used for illustrative purposes.

Clocked half-rail differential logic circuit 100 had two modes, or phases, of operation; a pre-charge phase and an evaluation phase. In one embodiment of a clocked half-rail differential logic circuit 100, in the pre-charge phase, the signal CLK was low or a digital "0" and the signal CLKBAR was high or a digital "1". Consequently, first PFET 101 and second NFET 125 were not conducting or were "off" and logic block 123 was isolated from first supply voltage 102 and second supply voltage 128. In addition, during the pre-charge phase, first NFET 109 was conducting or was "on" and, therefore, OUT terminal 111 was shorted to OUTBAR terminal 113. Consequently, the supply voltage to logic block 123 was approximately half the supply voltage 102, i.e., for a first supply voltage 102 of Vdd and a second supply voltage 128 of ground, logic block 123 operated at around Vdd/2. During pre-charge, second and third PFETs 105 and 107 were typically not performing any function.

In one embodiment of a clocked half-rail differential logic circuit 100, in the evaluation phase, the signal CLK was high or a digital "1" and the signal CLKBAR was low or a digital "0". Consequently, first PFET 101 and second NFET 125 were conducting or were "on" and first NFET 109 was not conducting or was "off". Consequently, depending on the particular logic in logic block 123, either second PFET 105, or third PFET 107, was conducting or was "on" and the other of second PFET 105, or third PFET 107, was not conducting or was "off". As a result, either OUT terminal 111 went from approximately half first supply voltage 102 to approximately second supply voltage 128 or OUTBAR terminal 113 went from approximately half first supply voltage 102 to approximately first supply voltage 102, i.e., for a first supply voltage 102 of Vdd and a second supply voltage 128 of ground, OUT terminal 111 went from approximately Vdd/2 to zero and OUTBAR terminal 113 went from approximately Vdd/2 to Vdd.

Clocked half-rail differential logic circuits 100 marked a significant improvement over prior art half-rail logic circuits in part because clocked half-rail differential logic circuit 100 does not require the complex control circuit of prior art half-rail differential logic circuits and is therefore simpler, saves space and is more reliable than prior art half-rail differential logic circuits. As a result, clocked half-rail differential logic circuits 100 are better suited to the present electronics market that stresses portability, compact size, lightweight and the capability for prolonged remote operation. However, clocked half-rail differential logic circuit 100 has some limitations.

For instance, as noted above, since clocked half-rail differential logic circuit 100 was a dual rail logic circuit, requiring an output OUT 111 and a complementary output OUTBAR 113, in the prior art, logic block 123 had to include both a base logic function, via base logic portion 123A of logic block 123, such as an AND gate, OR gate, XOR gate, etc. and the complementary logic function, via complementary logic portion 123B of logic block 123, such as a NAND gate, NOR gate, XNOR gate, etc.

FIG. 1B shows one particular embodiment of a clocked half-rail differential logic circuit 100A that includes a base logic portion 123A that is an AND gate and a complementary logic portion 123B that is a NAND gate. As shown in FIG. 1B, AND gate 123A includes NFET 161 and NFET 163 in series. Input 151 is coupled to the control electrode, or gate, of NFET 161 and input 153 is coupled to the control electrode or gate of NFET 163. As also shown in FIG. 1B, NAND gate 123B includes NFET 171 and NFET 173 in parallel. Input 151BAR is coupled to the control electrode, or gate, of NFET 171 and input 153BAR is coupled to the control electrode or gate of NFET 173. Consequently, in the prior art, four transistors were required to provide the output OUT 111 and its complementary output OUTBAR 113.

This need in the prior art to include both a base logic function and its complementary logic function resulted in an increase in power usage, an increase in space used, an increase in design complexity, and an increase in heat production.

What is needed is a method and apparatus for creating clocked half-rail differential logic circuits that use less power and, therefore, generate less heat, require less space, and are simpler in design so that they are more flexible, more space efficient and more reliable than prior art half-rail differential logic circuits.

SUMMARY OF THE INVENTION

According to the invention, the clocked half-rail differential logic circuits with single-rail logic of the invention do not include complementary logic portions. According to the invention, the complementary logic function of the prior art is replaced by a single transistor appropriately sized to provide the complementary output OUTBAR. Consequently, clocked half-rail differential logic circuits with single-rail logic of the invention use less power and, therefore, generate less heat, require less space, and are simpler in design so that they are more flexible, more space efficient and more reliable than prior art half-rail differential logic circuits.

The clocked half-rail differential logic circuits with single-rail logic of the invention can be cascaded together to form the chains commonly used in the industry. When the clocked half-rail differential logic circuits with single-rail logic of the invention are cascaded together, the advantages of the clocked half-rail differential logic circuits of the invention are particularly evident and the gains in terms of power efficiency, size reduction, and flexibility are further pronounced.

One embodiment of the invention is a clocked half-rail differential logic circuit with single-rail logic that includes a clocked half-rail differential logic circuit with single-rail logic OUT terminal and a clocked half-rail differential logic circuit with single-rail logic OUTBAR terminal.

The clocked half-rail differential logic circuit with single-rail logic also includes a first transistor including a first transistor first flow electrode, a first transistor second flow electrode and a first transistor control electrode. The first transistor first flow electrode is coupled to a first supply voltage.

The clocked half-rail differential logic circuit with single-rail logic also includes a second transistor, the second transistor including a second transistor first flow electrode, a second transistor second flow electrode and a second transistor control electrode. The first transistor second flow electrode is coupled to the second transistor first flow electrode and the second transistor second flow electrode is coupled to the clocked half-rail differential logic circuit with single-rail logic OUT terminal.

The clocked half-rail differential logic circuit with single-rail logic also includes a third transistor, the third transistor including a third transistor first flow electrode, a third transistor second flow electrode and a third transistor control electrode. The first transistor second flow electrode is coupled to the third transistor first flow electrode and the third transistor second flow electrode is coupled to the clocked half-rail differential logic circuit with single-rail logic OUTBAR terminal.

The clocked half-rail differential logic circuit with single-rail logic also includes a fourth transistor, the fourth transistor including a fourth transistor first flow electrode, a fourth transistor second flow electrode and a fourth transistor control electrode. The second transistor control electrode is coupled to the fourth transistor first flow electrode and the clocked half-rail differential logic circuit with single-rail logic OUTBAR terminal. The third transistor control electrode is coupled to the fourth transistor second flow electrode and the clocked half-rail differential logic circuit with single-rail logic OUT terminal.

The clocked half-rail differential logic circuit with single-rail logic also includes a base logic portion, the base logic portion including a base logic portion first input terminal, a base logic portion second input terminal, a base logic portion OUT terminal, and a base logic portion fourth terminal. The base logic portion OUT terminal is coupled to the clocked half-rail differential logic circuit with single-rail logic OUT terminal.

The clocked half-rail differential logic circuit with single-rail logic also includes a fifth transistor, the fifth transistor including a fifth transistor first flow electrode, a fifth transistor second flow electrode and a fifth transistor control electrode. The fifth transistor first flow electrode is coupled to the base logic portion fourth terminal and the fifth transistor second flow electrode is coupled to a second supply voltage.

The clocked half-rail differential logic circuit with single-rail logic also includes a complementary output transistor, the complementary output transistor including a complementary output transistor first flow electrode, a complementary output transistor second flow electrode and a complementary output transistor control electrode. According to the invention, the complementary output transistor first flow electrode is coupled to the second flow electrode of the third transistor and the OUTBAR terminal of the clocked half-rail differential logic circuit with single-rail logic. The complementary output transistor second flow electrode is coupled to the first flow electrode of the fifth transistor. The complementary output transistor control electrode is coupled to the second flow electrode of the fourth transistor and the OUT terminal of the clocked half-rail differential logic circuit with single-rail logic.

A clock signal CLK is coupled to the control electrode of the fifth transistor of the clocked half-rail differential logic circuit with single-rail logic. A clock-not signal CLKBAR is coupled to the control electrode of the first transistor of the clocked half-rail differential logic circuit with single-rail logic and the control electrode of the fourth transistor of the clocked half-rail differential logic circuit with single-rail logic.

The clocked half-rail differential logic circuits with single-rail logic of the invention provide the complementary output OUTBAR without the need for the complementary logic elements. Consequently, clocked half-rail differential logic circuits with single-rail logic of the invention use less power and, therefore, generate less heat, require less space, and are simpler in design so that they are more flexible, more space efficient and more reliable than prior art half-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
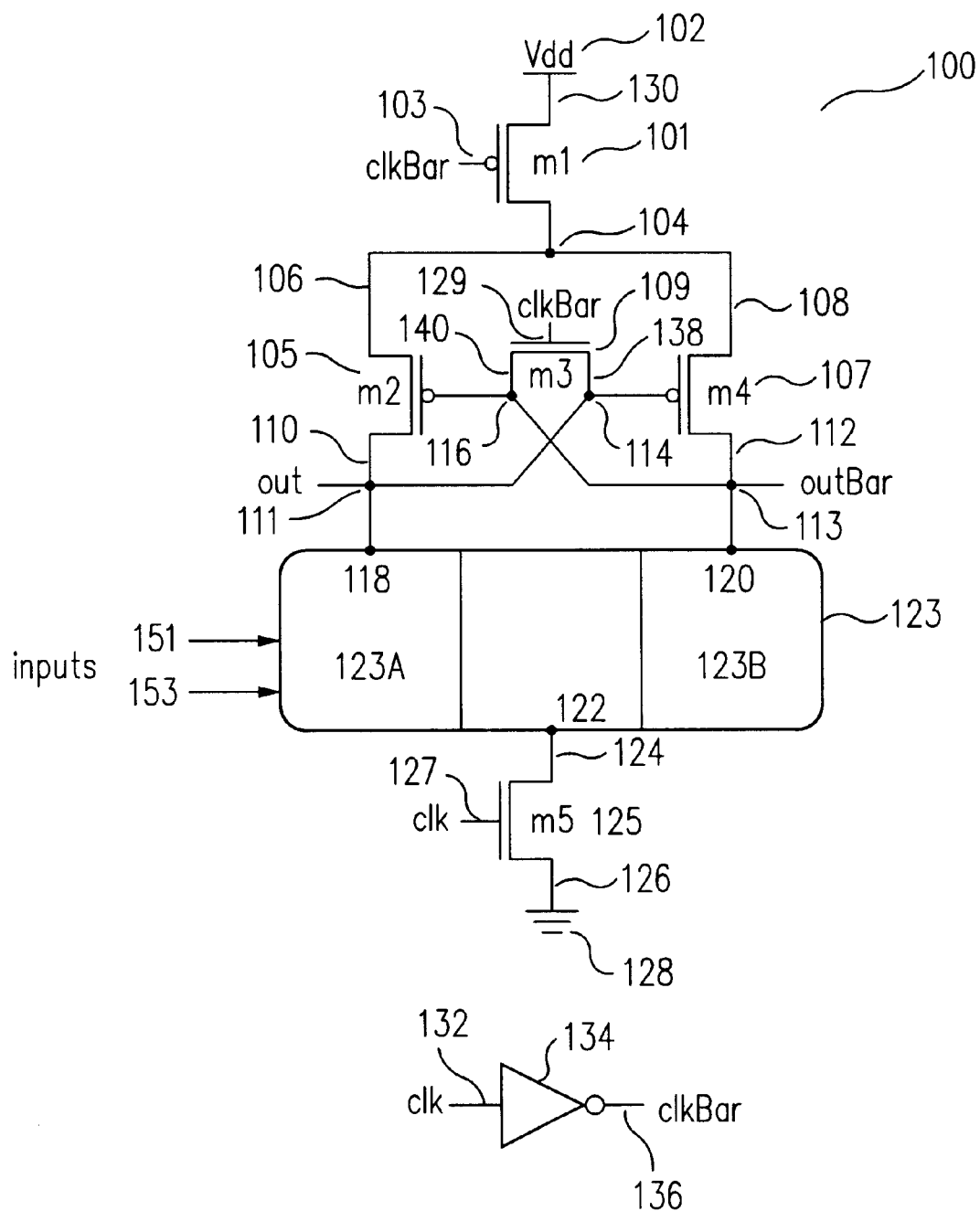
FIG. 1A shows a schematic diagram of a clocked half-rail differential logic circuit.
Figure 1B:
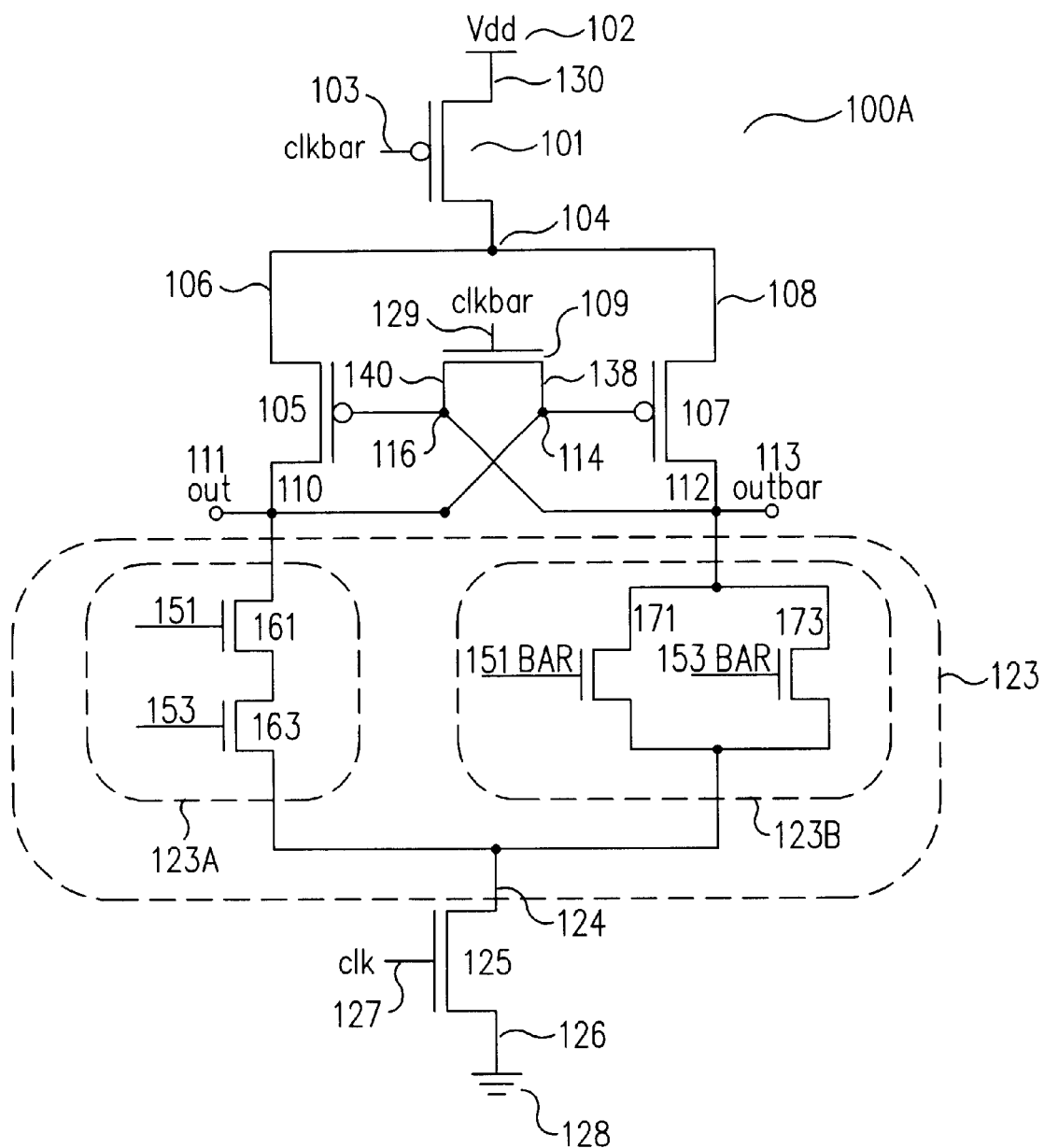
FIG. 1B shows one particular embodiment of a clocked half-rail differential logic circuit that includes a base logic portion that is an AND gate and a complementary logic portion that is a NAND gate.

According to the invention, the clocked half-rail differential logic circuits with single-rail logic (200A in FIG. 2A, 200B in FIG. 2B and 300A, 300B, 300C and 300N in FIG. 3) of the invention do not include complementary logic portions (123B in FIGS. 1A and 1B). According to the invention, the complementary logic function of the prior art is replaced by a single complementary output transistor (281 in FIGS. 2A and 2B) appropriately sized to provide the complementary output OUTBAR (213 in FIGS. 2A and 2B). Consequently, clocked half-rail differential logic circuits with single-rail logic of the invention use less power and, therefore, generate less heat, require less space, and are simpler in design so that they are more flexible, more space efficient and more reliable than prior art half-rail differential logic circuits.

The clocked half-rail differential logic circuits with single-rail logic of the invention can be cascaded together to form the chains (301 in FIG. 3) commonly used in the industry. When the clocked half-rail differential logic circuits with single-rail logic of the invention are cascaded together, the advantages of the clocked half-rail differential logic circuits of the invention are particularly evident and the gains in terms of power efficiency, size reduction, and flexibility are further pronounced.

Figure 2A:
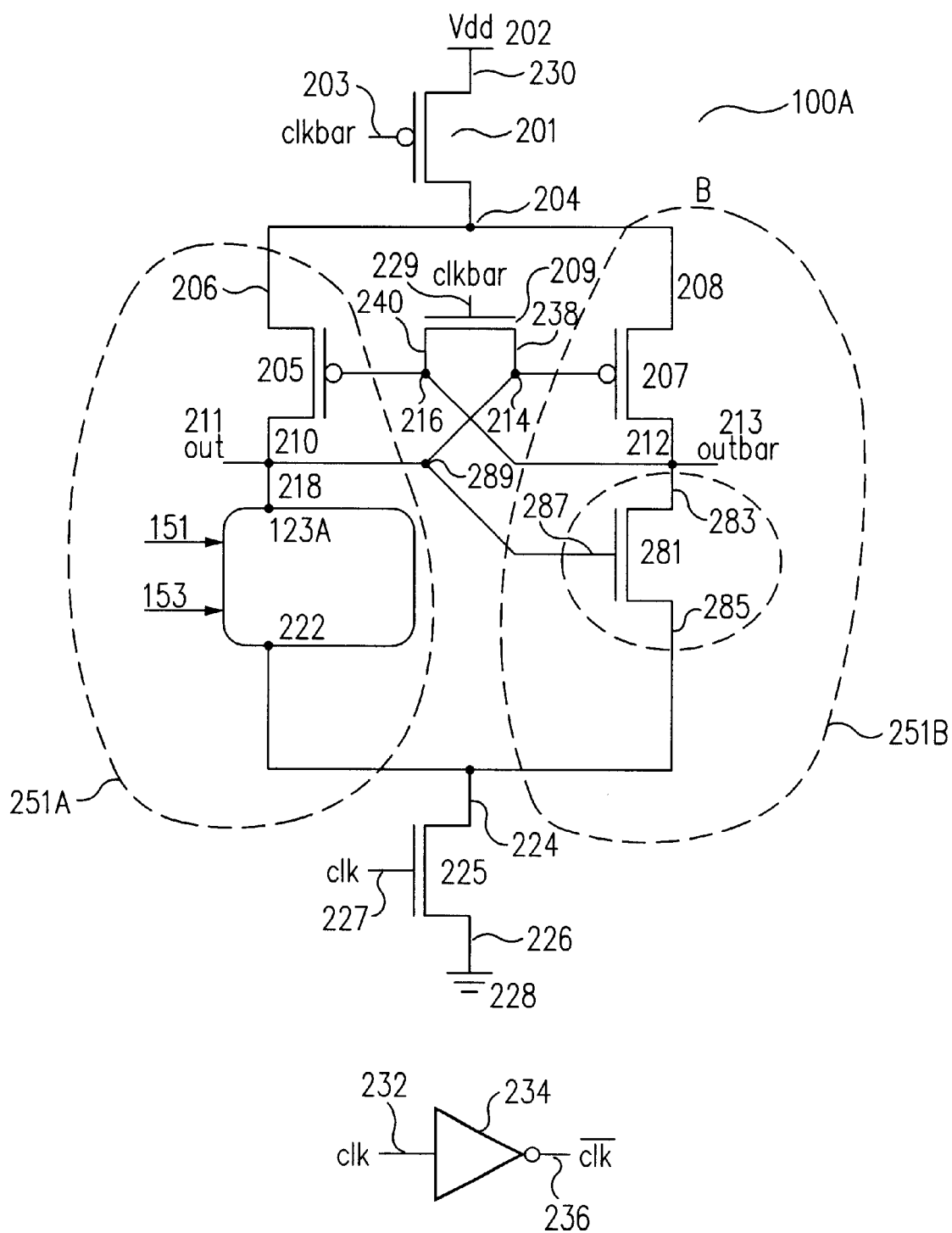
FIG. 2A shows a schematic diagram of one embodiment of a clocked half-rail differential logic circuit with single-rail logic designed according to the principles of the present invention.

FIG. 2A shows a schematic diagram of one embodiment of a clocked half-rail differential logic circuit with single-rail logic 200A designed according to the principles of the present invention. As seen in FIG. 2A, a clock signal CLK is coupled to an input node 232 of a clock inverter 234 to yield a clock-not signal CLKBAR at output node 236 of clock inverter 234.

As also seen in FIG. 2A, clocked half-rail differential logic circuit with single-rail logic 200A includes a first supply voltage 202 coupled to a source, or first flow electrode 230, of a PFET 201. The signal CLKBAR is coupled to a control electrode or gate 203 of PFET 201 and a control electrode or gate 229 of an NFET 209. A drain, or second flow electrode 204, of PFET 201 is coupled to both a source, or first flow electrode 206, of a PFET 205 and a source, or first flow electrode 208, of a PFET 207. A control electrode or gate 216 of PFET 205 is coupled to a first flow electrode 240 of NFET 209 and an OUTBAR terminal 213. A control electrode or gate 214 of PFET 207 is coupled to a second flow electrode 238 of NFET 209 and an OUT terminal 211. A drain, or second flow electrode 210, of PFET 205 is coupled to OUT terminal 211 and a drain, or second flow electrode 212, of PFET 207 is coupled to OUTBAR terminal 213.

OUT terminal 211 is coupled to a first terminal 218 of a base logic portion 123A. Base logic portion 123A includes any type of differential logic and/or circuitry used in the art including various logic gates, logic devices and circuits such as AND gates, NAND gates, NOR gates, XOR gates etc. Base logic portion 123A also includes first and second input terminals 151 and 153 that are typically coupled to an OUT and OUTBAR terminal of a previous clocked half-rail differential logic circuit with single-rail logic stage (not shown).

Base logic portion 123A also includes fourth terminal 222 coupled to a drain, or first flow electrode 224, of an NFET 225. A gate or control electrode 227 of NFET 225 is coupled to the signal CLK and a source, or second flow electrode 226, of NFET 225 is coupled to a second supply voltage 228.

According to the invention, clocked half-rail differential logic circuit with single-rail logic 200A also includes a complementary output transistor 281. Complementary output transistor includes a complementary output transistor first flow electrode 283, a complementary output transistor second flow electrode 285 and a complementary output transistor control electrode 287. According to the invention, complementary output transistor first flow electrode 283 is coupled to second flow electrode 212 of PFET 207 and OUTBAR terminal 213 of clocked half-rail differential logic circuit with single-rail logic 200A. Complementary output transistor second flow electrode 285 is coupled to first flow electrode 224 of NFET 225. According to the invention, complementary output transistor control electrode 287 is coupled to second flow electrode 238 of the NFET 209 and OUT terminal 211 of clocked half-rail differential logic circuit with single-rail logic 200A.

As shown above, according to the invention, the complementary logic portion 123B in FIGS. 1A and 1B, is eliminated and replaced by complementary output transistor 281

(FIG. 2A). According to the invention, complementary output transistor 281 is sized, i.e., has channel dimensions, i.e., channel width, which are smaller than the effective channel dimensions, i.e., effective channel width, of the transistors making up base logic portion 123A. According to the invention, this is specifically done to insure that discharge path 251A, between OUT terminal 211 and second supply voltage 228 through base logic portion 123A, is faster than the discharge path 251B, between OUTBAR terminal 213 and second supply voltage 228, through complementary output transistor 281, to insure proper operation of clocked half-rail differential logic circuit with single-rail logic 200A. In operation, in the pre-charge phase, i.e., when signal CLK on control electrode, or gate, 227 of NFET 225 is low, NFET 209 shorts the complementary terminals OUT 211 and OUTBAR 213 to each other, thereby equalizing the voltage on complementary terminals OUT 211 and OUTBAR 213 at near half supply voltage 202, in one embodiment Vdd/2. The voltage levels at input terminals 151 and 153 are also at near half supply voltage 202, in one embodiment Vdd/2.

In the evaluation phase, i.e., when signal CLK on control electrode, or gate, 227 of NFET 225 switches to high, NFET 225 conducts, PFET 201 conducts, NFET 209 is off, and complementary output transistor 281 starts to conduct. If the combination of input signals on terminals 151 and 153 provides a path to second supply voltage 228, in one embodiment ground, on OUT terminal 211, then OUT terminal 211 discharges to second supply voltage 228, in one embodiment ground, and shuts off complementary output transistor 281 since, as discussed above, according to the invention, the discharge path 251A of OUT terminal 211 is faster than the discharge path 251B of OUTBAR terminal 213. The cross-coupled transistor PFET 207 subsequently pulls OUTBAR terminal to first supply voltage 202, in one embodiment Vdd. If the combination of input signals on terminals 151 and 153 do not provide a path to ground for OUT terminal 211, then OUTBAR terminal 213 continues to discharge and PFET 205 charges OUT terminal 211 to first supply voltage 202, in one embodiment Vdd, when it reaches its conduction threshold.

A particular embodiment of a clocked half-rail differential logic circuit with single-rail logic 200A is shown in FIG. 2A. Those of skill in the art will recognize that clocked half-rail differential logic circuit with single-rail logic 200A can be easily modified. For example, different transistors, i.e., PFETs 201, 205 and 207 or NFETs 209 and 225 can be used. In particular, the NFETs and PFETS shown in FIG. 2A can be readily exchanged for PFETs and NFETs by reversing the polarities of the supply voltages 202 and 228, or by other well known circuit modifications. Consequently, the clocked half-rail differential logic circuit with single-rail logic 200A that is shown in FIG. 2A is simply used for illustrative purposes.

Figure 2B:
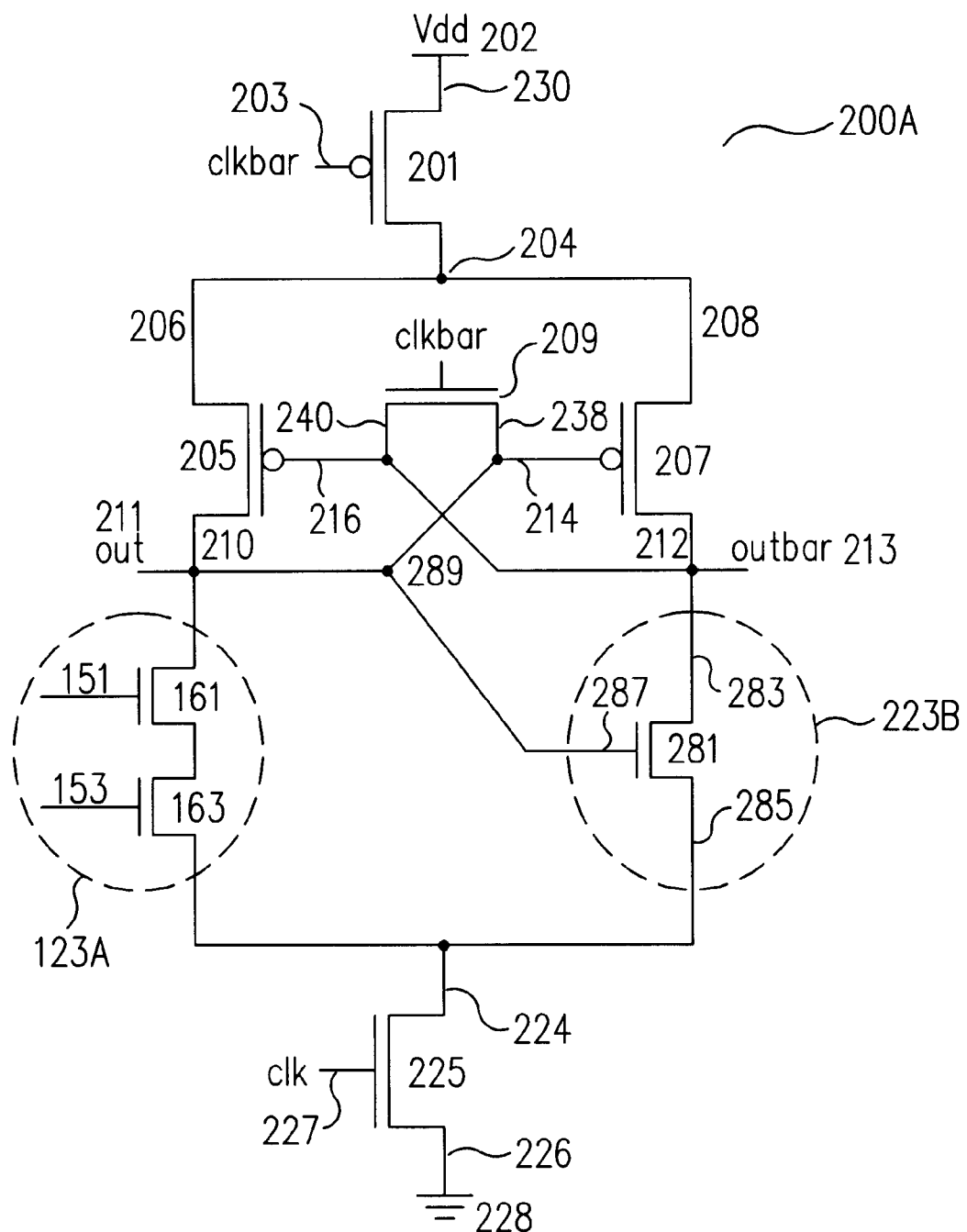
FIG. 2B shows one particular embodiment of a clocked half-rail differential logic circuit with single-rail logic that includes a base logic portion that is an AND gate.

FIG. 2B shows one particular embodiment of a clocked half-rail differential logic circuit with single-rail logic 200B that includes a base logic portion 123A that is an AND gate. As shown in FIG. 2B, AND gate 123A includes NFET 161 and NFET 163 in series. Input 151 is coupled to the control electrode, or gate, of NFET 161 and input 153 is coupled to the control electrode or gate of NFET 163. As also shown in FIG. 2B, according to the invention, NAND gate 123B of FIG. 1B, including NFET 171 and NFET 173 in parallel, is replaced by complementary output transistor 281 (FIG. 2B). Consequently, in this most simple example, using the method and structure of the invention results an over 10% reduction in components. Of course, those of skill in the art will recognize that when more complicated logic functions make up base logic portion 123A, using the present invention, even more components will be eliminated at an even greater savings in terms of dissipated power and heat, space, and circuit complexity.

As discussed above, clocked half-rail differential logic circuit with single-rail logic 200A can be cascaded together with other clocked half-rail differential logic circuits with single-rail logic 200A to form the chains commonly used in the industry. When clocked half-rail differential logic circuits with single-rail logic 200A of the invention are cascaded together, the advantages of clocked half-rail differential logic circuit with single-rail logic 200A is particularly evident and the gains in terms of power efficiency, size reduction and flexibility are further pronounced.

When clocked half-rail differential logic circuits with single-rail logic 200A of the invention are cascaded together, the advantages of clocked half-rail differential logic circuit with single-rail logic 200A is particularly evident and the gains in terms of efficiency, size reduction and flexibility are further pronounced. When clocked half-rail differential logic circuits with single-rail logic 200A of the invention are cascaded together, the clock signal CLK is, according to the invention, timed to be at least the delay of the previous clocked half-rail differential logic circuit with single-rail logic 200A (not shown) to ensure each clocked half-rail differential logic circuit with single-rail logic 200A of the invention is switched or "fired" only after it has received an input from the previous clocked half-rail differential logic circuit with single-rail logic 200A.

Figure 3:
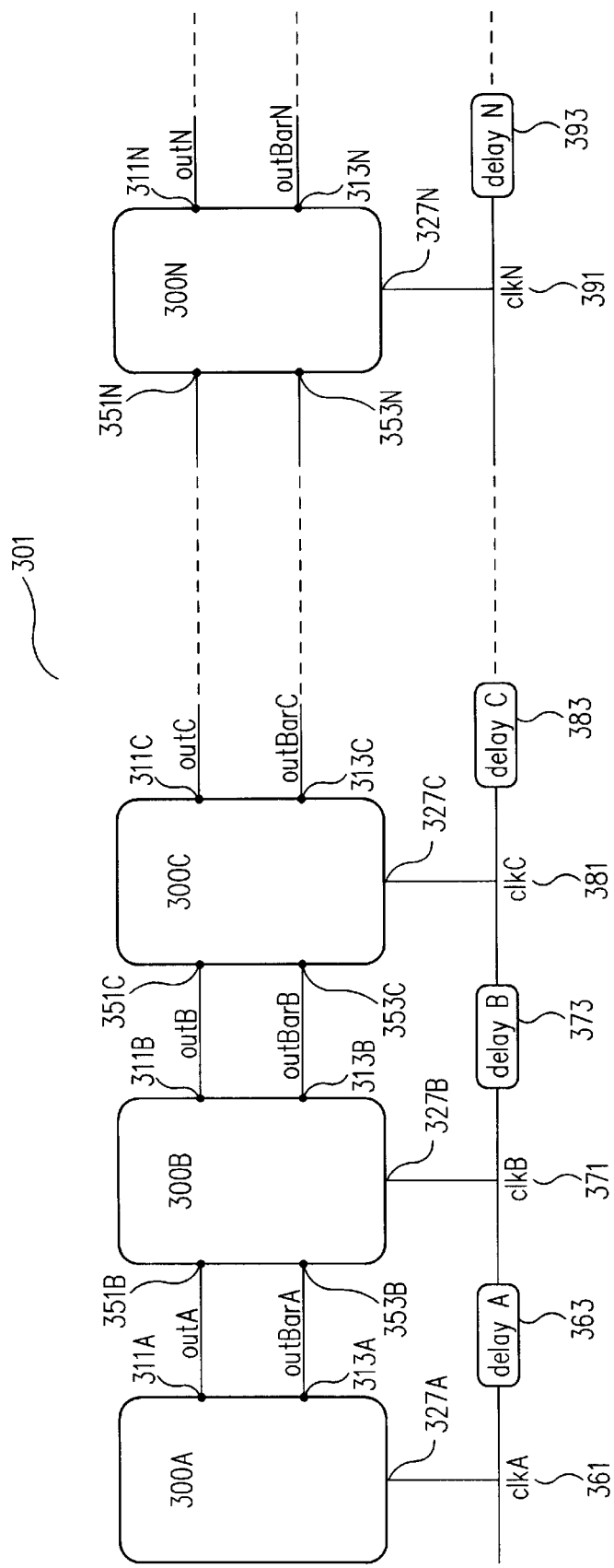
FIG. 3 shows one embodiment of a cascaded chain of clocked half-rail differential logic circuits with single-rail logic according to the principles of the present invention.

FIG. 3 shows one embodiment of a cascaded chain 301 of clocked half-rail differential logic circuits with single-rail logic 300A, 300B, and 300C and 300N of the present invention. Each clocked half-rail differential logic circuit with single-rail logic 300A, 300B, 300C and 300N represents a stage in cascaded chain 301. In one embodiment of the invention, each clocked half-rail differential logic circuit with single-rail logic 300A, 300B, 300C and 300N is similar to clocked half-rail differential logic circuit with single-rail logic 200A discussed above with respect to FIG. 2A.

As seen in FIG. 3, clocked half-rail differential logic circuit with single-rail logic 300A includes: a clock input terminal 327A; an out terminal 311A; and an outBar terminal 313A. Clocked half-rail differential logic circuit with single-rail logic 300B includes: a clock input terminal 327B; an input terminal 351B, coupled to out terminal 311A of clocked half-rail differential logic circuit with single-rail logic 300A; an inputBar terminal 353B, coupled to outBar terminal 313A of clocked half-rail differential logic circuit with single-rail logic 300A; an output terminal 311B; and an outBar terminal 313B. Likewise, clocked half-rail differential logic circuit with single-rail logic 300C includes: a clock input terminal 327C; an input terminal 351C, coupled to output terminal 311B of clocked half-rail differential logic circuit with single-rail logic 300B; an inputBar terminal 353C, coupled to outBar terminal 313B of clocked half-rail differential logic circuit with single-rail logic 300B; an output terminal 311C; and an outBar terminal 313C. Clocked half-rail differential logic circuit with single-rail logic 300N includes: a clock input terminal 327N; an input terminal 351N, coupled to an output terminal 311N−1 (not shown) of a clocked half-rail differential logic circuit with single-rail logic 300N−1 (not shown); an inputBar terminal 353N, coupled to an outBar terminal 313N−1 (not shown) of a clocked half-rail differential logic circuit with single-rail logic 300N−1 (not shown); an output terminal 311N; and an outBar terminal 313N.

According to the invention, any number of clocked half-rail differential logic circuits with single-rail logic 300A, 300B, 300C and 300N can be employed with cascaded chain 301. As also shown in FIG. 3, and discussed above, output terminal 311A of clocked half-rail differential logic circuit with single-rail logic 300A couples signal OUTA to input terminal 351B of clocked half-rail differential logic circuit with single-rail logic 300B and outBar terminal 313A of clocked half-rail differential logic circuit with single-rail logic 300A couples signal OUTBARA to inputBar terminal 353B of clocked half-rail differential logic circuit with single-rail logic 300B. Likewise, output terminal 311B of clocked half-rail differential logic circuit with single-rail logic 300B couples signal OUTB to input terminal 351C of clocked half-rail differential logic circuit with single-rail logic 300C and outBar terminal 313B of clocked half-rail differential logic circuit with single-rail logic 300B couples signal OUTBARB to inputBar terminal 353C of clocked half-rail differential logic circuit with single-rail logic 300C. In addition, output terminal 311N of clocked half-rail differential logic circuit with single-rail logic 300N couples signal OUTN to an input terminal 351N+1 (not shown) of a clocked half-rail differential logic circuit with single-rail logic 300N+1 (not shown) and outBar terminal 313N of clocked half-rail differential logic circuit with single-rail logic 300N couples signal OUTBARN to an inputBar terminal 353N+1 (not shown) of a clocked half-rail differential logic circuit with single-rail logic 300N+1 (not shown).

In addition to the structure discussed above, according to the invention, each clocked half-rail differential logic circuit with single-rail logic 300A, 300B, 300C and 300N of cascaded chain 301 receives its own delayed clock signal CLKA 361, CLKB 371, CLKC 381 and CLKN 391, respectively. According to the invention clock signals CLKA 361, CLKB 371, CLKC 381 and CLKN 391 are provided to clocked half-rail differential logic circuits with single-rail logic 300A, 300B, 300C and 300N, respectively, by introducing delay circuits 363, 373, 383 and 393 between successive clocked half-rail differential logic circuits with single-rail logic 300A, 300B, 300C and 300N. Consequently, delay circuit 363 introduces a delay time between signal CLKA 361, coupled to clock input terminal 327A of clocked half-rail differential logic circuit with single-rail logic 300A, and signal CLKB 371, coupled to clock input terminal 327B of clocked half-rail differential logic circuit with single-rail logic 300B. Delay circuit 373 introduces a delay time between signal CLKB 371 and signal CLKC 381, coupled to clock input terminal 327C of clocked half-rail differential logic circuit with single-rail logic 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to clock input terminal 327N of clocked half-rail differential logic circuit with single-rail logic 300N, and a further delay circuit 393 introduces a further delay time between CLKN 391 and CLK N+1 (not shown) coupled to a clock input terminal 327N+1 (not shown) of a clocked half-rail differential logic circuit with single-rail logic 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked half-rail differential logic circuit with single-rail logic 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked half-rail differential logic circuit with single-rail logic 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

Figure 4:
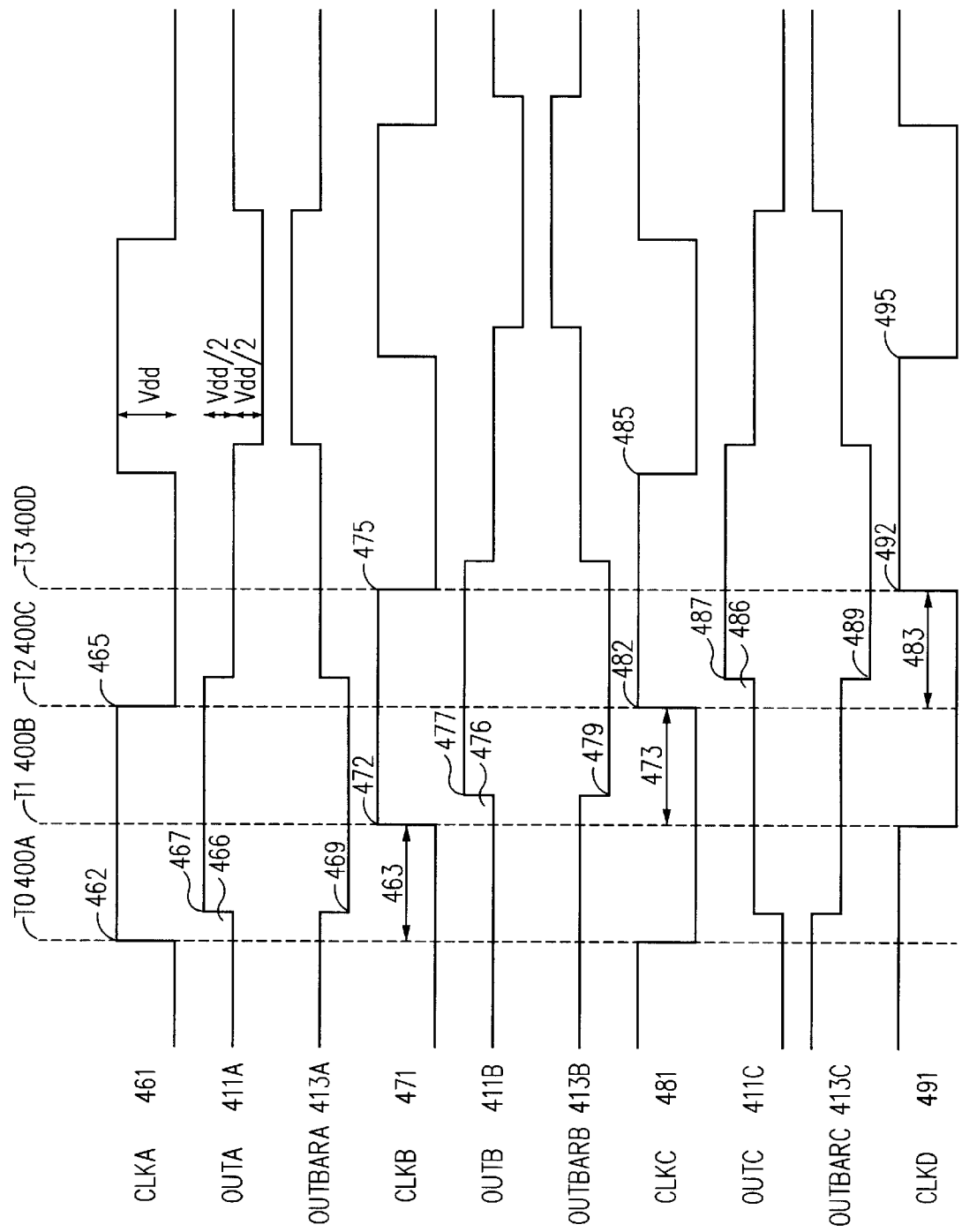
FIG. 4 is a one embodiment of a timing diagram for the cascaded chain of clocked half-rail differential logic circuits with single-rail logic of the invention shown in FIG. 3.

FIG. 4 is one embodiment of a timing diagram for cascaded chain 301 of clocked half-rail differential logic circuits with single-rail logic 300A, 300B, and 300C and 300N of FIG. 3. As seen in FIG. 3 and FIG. 4 together, according to one embodiment of the invention, at time T0, i.e., point 400A in FIG. 4, signal CLKA 461 goes high. After a short switching delay 466, such as the short switching delay inherent in any circuit, signal OUTA 411A at out terminal 311A switches high at point 467 and signal OUTBARA at outBar terminal 313A switches low at point 469. A delay time 463 from point T0 400A and to point T1 400B is introduced by delay circuit 363. As discussed above, delay time 463 helps ensure clocked half-rail differential logic circuit with single-rail logic 300B receives signals OUTA and OUTBARA from clocked half-rail differential logic circuit with single-rail logic 300A before the switching of signal CLKB 471.

At point 472 in FIG. 4, i.e., at point T1 400B, signal CLKB 471 switches high. After a short switching delay 476, signal OUTB 411B at out terminal 311B switches high at point 477 and signal OUTBARB 413B at outBar terminal 313B switches low at point 479. A delay time 473 from point T1 400B to point T2 400C is introduced by delay circuit 373. As discussed above, delay time 473 helps ensure clocked half-rail differential logic circuit with single-rail logic 300C receives signals OUTB and OUTBARB from clocked half-rail differential logic circuit with single-rail logic 300B before the switching of signal CLKC 481.

At point 482 in FIG. 4, i.e., at point T2 400C, signal CLKC 481 switches high. After a short switching delay 486, signal OUTC 411C at out terminal 311C switches high at point 487 and signal OUTBARC at outBar terminal 313C switches low at point 489. A delay time 483 from point T2 400C to point T3 400D is introduced by delay circuit 383. As discussed above, delay time 483 helps ensure the following clocked half-rail differential logic circuit with single-rail logic (not shown) receives signals OUTC and OUTBARC from clocked half-rail differential logic circuit with single-rail logic 300C before the switching of signal CLKD 491.

At point 492 in FIG. 4, i.e., at point T3 400D, signal CLKD 491 switches high.

As discussed above, according to the invention, any number of clocked half-rail differential logic circuits with single-rail logic 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As also discussed above, the clocked half-rail differential logic circuits with single-rail logic of the invention can be cascaded together to form the chains commonly used in the industry. When the clocked half-rail differential logic circuits of the invention are cascaded together, the advantages of the clocked half-rail differential logic circuits of the invention are particularly evident and the gains in terms of power efficiency, size reduction, heat reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A method for clock control of a cascaded chain of clocked half-rail differential logic circuits with single-rail logic comprising:
    providing a first clocked half-rail differential logic circuit with single-rail logic, said first clocked half-rail differential logic circuit with single-rail logic comprising:
        a first clocked half-rail differential logic circuit with single-rail logic clock input terminal;
        at least one first clocked half-rail differential logic circuit with single-rail logic data input terminal; and
        at least one first clocked half-rail differential logic circuit with single-rail logic data output terminal;
    providing a second clocked half-rail differential logic circuit with single-rail logic, said second clocked half-rail differential logic circuit with single-rail logic comprising:
        a second clocked half-rail differential logic circuit with single-rail logic clock input terminal;
        at least one second clocked half-rail differential logic circuit with single-rail logic data input terminal; and
        at least one second clocked half-rail differential logic circuit with single-rail logic data output terminal;
    operatively coupling a first clock signal to said first clocked half-rail differential logic circuit with single-rail logic clock input terminal;
    operatively coupling a second clock signal coupled to said second clocked half-rail differential logic circuit with single-rail logic clock input terminal;
    operatively coupling said at least one first clocked half-rail differential logic circuit with single-rail logic data output terminal to said at least one second clocked half-rail differential logic circuit with single-rail logic data input terminal; and
    delaying said second clock signal with respect to said first clock signal by a predetermined delay time.

2. The method for clock control of a cascaded chain of clocked half-rail differential logic circuits with single-rail logic of claim 1, further comprising:
    operatively coupling a delay circuit between said first clocked half-rail differential logic circuit with single-rail logic clock input terminal and said second clocked half-rail differential logic circuit with single-rail logic clock input terminal for delaying said second clock signal with respect to said first clock signal by said predetermined delay time.

3. The method for clock control of a cascaded chain of clocked half-rail differential logic circuits with single-rail logic of claim 2, wherein;
    said delay circuit comprises at least one inverter.

4. The method for clock control of a cascaded chain of clocked half-rail differential logic circuits with single-rail logic of claim 2, wherein;
    said first clocked half-rail differential logic circuit with single-rail logic comprises a base logic portion coupled to a first clocked half-rail differential logic circuit with single-rail logic OUT terminal, further wherein;
    said first clocked half-rail differential logic circuit with single-rail logic comprises a complementary output transistor coupled to a first clocked half-rail differential logic circuit with single-rail logic OUTBAR terminal, further wherein;
    said second clocked half-rail differential logic circuit with single-rail logic comprises a base logic portion coupled to a second clocked half-rail differential logic circuit with single-rail logic OUT terminal; and
    said second clocked half-rail differential logic circuit with single-rail logic comprises a complementary output transistor coupled to a second clocked half-rail differential logic circuit with single-rail logic OUTBAR terminal.

5. A method for clock control of a cascaded chain of clocked half-rail differential logic circuits with single-rail logic comprising:
    providing a first supply voltage;
    providing a second supply voltage;
    providing a first clocked half-rail differential logic circuit with single-rail logic, said first clocked half-rail differential logic circuit with single-rail logic comprising:
        a first clocked half-rail differential logic circuit with single-rail logic OUT terminal;
        a first clocked half-rail differential logic circuit with single-rail logic OUTBAR terminal;
        a first transistor, said first transistor comprising a first transistor first flow electrode, a first transistor second flow electrode and a first transistor control electrode, said first supply voltage being coupled to said first transistor first flow electrode;
        a second transistor, said second transistor comprising a second transistor first flow electrode, a second transistor second flow electrode and a second transistor control electrode, said first transistor second flow electrode being coupled to said second transistor first flow electrode, said second transistor second flow electrode being coupled to said first clocked half-rail differential logic circuit with single-rail logic OUT terminal;
        a third transistor, said third transistor comprising a third transistor first flow electrode, a third transistor second flow electrode and a third transistor control electrode, said first transistor second flow electrode being coupled to said third transistor first flow electrode, said third transistor second flow electrode being coupled to said first clocked half-rail differential logic circuit with single-rail logic OUTBAR terminal;
        a fourth transistor, said fourth transistor comprising a fourth transistor first flow electrode, a fourth transistor second flow electrode and a fourth transistor control electrode, said second transistor control electrode being coupled to said fourth transistor first flow electrode and said first clocked half-rail differential logic circuit with single-rail logic OUTBAR terminal, said third transistor control electrode being coupled to said fourth transistor second flow electrode and said first clocked half-rail differential logic circuit with single-rail logic OUT terminal;

a base logic portion, said base logic portion comprising a base logic portion first input terminal, a base logic portion second input terminal, a base logic portion OUT terminal, and a base logic portion fourth terminal, said base logic portion OUT terminal being coupled to said first clocked half-rail differential logic circuit with single-rail logic OUT terminal;

a fifth transistor, said fifth transistor comprising a fifth transistor first flow electrode, a fifth transistor second flow electrode and a fifth transistor control electrode, said fifth transistor first flow electrode being coupled to said base logic portion fourth terminal, said fifth transistor second flow electrode being coupled to said second supply voltage, said fifth transistor control electrode being coupled to a first clock signal;

a complementary output transistor, said complementary output transistor comprising a complementary output transistor first flow electrode, a complementary output transistor second flow electrode and a complementary output transistor control electrode, said complementary output transistor first flow electrode being coupled to said third transistor second flow electrode and said first clocked half-rail differential logic circuit with single-rail logic OUTBAR terminal, said complementary output transistor second flow electrode being coupled to said fifth transistor first flow electrode, said complementary output transistor control electrode being coupled to said fourth transistor second flow electrode and said first clocked half-rail differential logic circuit with single-rail logic OUT terminal;

providing a second clocked half-rail differential logic circuit with single-rail logic, said second clocked half-rail differential logic circuit with single-rail logic comprising:

a second clocked half-rail differential logic circuit with single-rail logic OUT terminal;

a second clocked half-rail differential logic circuit with single-rail logic OUTBAR terminal;

a first transistor, said first transistor comprising a first transistor first flow electrode, a first transistor second flow electrode and a first transistor control electrode, said first supply voltage being coupled to said first transistor first flow electrode;

a second transistor, said second transistor comprising a second transistor first flow electrode, a second transistor second flow electrode and a second transistor control electrode, said first transistor second flow electrode being coupled to said second transistor first flow electrode, said second transistor second flow electrode being coupled to said second clocked half-rail differential logic circuit with single-rail logic OUT terminal;

a third transistor, said third transistor comprising a third transistor first flow electrode, a third transistor second flow electrode and a third transistor control electrode, said first transistor second flow electrode being coupled to said third transistor first flow electrode, said third transistor second flow electrode being coupled to said second clocked half-rail differential logic circuit with single-rail logic OUTBAR terminal;

a fourth transistor, said fourth transistor comprising a fourth transistor first flow electrode, a fourth transistor second flow electrode and a fourth transistor control electrode, said second transistor control electrode being coupled to said fourth transistor first flow electrode and said second clocked half-rail differential logic circuit with single-rail logic OUTBAR terminal, said third transistor control electrode being coupled to said fourth transistor second flow electrode and said second clocked half-rail differential logic circuit with single-rail logic OUT terminal;

a base logic portion, said base logic portion comprising a base logic portion first input terminal, a base logic portion second input terminal, a base logic portion OUT terminal, and a base logic portion fourth terminal, said base logic portion OUT terminal being coupled to said second clocked half-rail differential logic circuit with single-rail logic OUT terminal;

a fifth transistor, said fifth transistor comprising a fifth transistor first flow electrode, a fifth transistor second flow electrode and a fifth transistor control electrode, said fifth transistor first flow electrode being coupled to said base logic portion fourth terminal, said fifth transistor second flow electrode being coupled to said second supply voltage, said fifth transistor control electrode being coupled to a second clock signal;

a complementary output transistor, said complementary output transistor comprising a complementary output transistor first flow electrode, a complementary output transistor second flow electrode and a complementary output transistor control electrode, said complementary output transistor first flow electrode being coupled to said third transistor second flow electrode and said second clocked half-rail differential logic circuit with single-rail logic OUTBAR terminal, said complementary output transistor second flow electrode being coupled to said fifth transistor first flow electrode, said complementary output transistor control electrode being coupled to said fourth transistor second flow electrode and said second clocked half-rail differential logic circuit with single-rail logic OUT terminal; and delaying said second clock signal with respect to said first clock signal by a predetermined delay time.

6. The method for clock control of a cascaded chain of clocked half-rail differential logic circuits with single-rail logic of claim 5, wherein;

said base logic portion of said first clocked half-rail differential logic circuit with single-rail logic and said base logic portion of said second clocked half-rail differential logic circuit with single-rail logic comprise differential logic.

7. The method for clock control of a cascaded chain of clocked half-rail differential logic circuits with single-rail logic of claim 5, wherein;

said base logic portion of said first clocked half-rail differential logic circuit with single-rail logic and said base logic portion of said second clocked half-rail differential logic circuit with single-rail logic comprise differential logic gates.

8. The method for clock control of a cascaded chain of clocked half-rail differential logic circuits with single-rail logic of claim 5, wherein;

said base logic portion of said first clocked half-rail differential logic circuit with single-rail logic and said base logic portion of said second clocked half-rail differential logic circuit with single-rail logic comprise an AND gate.

9. The method for clock control of a cascaded chain of clocked half-rail differential logic circuits with single-rail logic of claim 5, wherein;

said first supply voltage is Vdd and said second supply voltage is ground.

10. The method for clock control of a cascaded chain of clocked half-rail differential logic circuits with single-rail logic of claim 9, wherein;

said first transistor, said second transistor, and said third transistor of said first clocked half-rail differential logic circuit with single-rail logic and said first transistor, said second transistor, and said third transistor of said second clocked half-rail differential logic circuit with single-rail logic are PFETs.

11. The method for clock control of a cascaded chain of clocked half-rail differential logic circuits with single-rail logic of claim 10, wherein;

said fourth transistor, said fifth transistor, and said complementary output transistor of said first clocked half-rail differential logic circuit with single-rail logic and said fourth transistor, said fifth transistor, and said complementary output transistor of said second clocked half-rail differential logic circuit with single-rail logic are NFETs.

12. A method for clock control of a clocked half-rail differential logic circuit with single-rail logic comprising:

providing a first supply voltage;

providing a second supply voltage;

providing a first transistor, said first transistor comprising a first transistor first flow electrode, a first transistor second flow electrode and a first transistor control electrode;

operatively coupling said first supply voltage to said first transistor first flow electrode;

providing a second transistor, said second transistor comprising a second transistor first flow electrode, a second transistor second flow electrode and a second transistor control electrode;

operatively coupling said first transistor second flow electrode to said second transistor first flow electrode;

operatively coupling said second transistor second flow electrode to said clocked half-rail differential logic circuit with single-rail logic OUT terminal;

providing a third transistor, said third transistor comprising a third transistor first flow electrode, a third transistor second flow electrode and a third transistor control electrode;

operatively coupling said first transistor second flow electrode to said third transistor first flow electrode;

operatively coupling said third transistor second flow electrode to said clocked half-rail differential logic circuit with single-rail logic OUTBAR terminal;

providing a fourth transistor, said fourth transistor comprising a fourth transistor first flow electrode, a fourth transistor second flow electrode and a fourth transistor control electrode;

operatively coupling said second transistor control electrode to said fourth transistor first flow electrode;

operatively coupling said second transistor control electrode to said clocked half-rail differential logic circuit with single-rail logic OUTBAR terminal;

operatively coupling said third transistor control electrode to said fourth transistor second flow electrode;

operatively coupling said third transistor control electrode to said clocked half-rail differential logic circuit with single-rail logic OUT terminal;

providing a base logic portion, said base logic portion comprising a base logic portion first input terminal, a base logic portion second input terminal, a base logic portion OUT-terminal, and a base logic portion fourth terminal;

operatively coupling said base logic portion OUT terminal to said clocked half-rail differential logic circuit with single-rail logic OUT terminal;

providing a fifth transistor, said fifth transistor comprising a fifth transistor first flow electrode, a fifth transistor second flow electrode and a fifth transistor control electrode;

operatively coupling said fifth transistor first flow electrode to said base logic portion fourth terminal;

operatively coupling said fifth transistor second flow electrode to said second supply voltage;

operatively coupling said fifth transistor control electrode to a clock signal;

providing a complementary output transistor, said complementary output transistor comprising a complementary output transistor first flow electrode, a complementary output transistor second flow electrode and a complementary output transistor control electrode;

operatively coupling said complementary output transistor first flow electrode to said third transistor second flow electrode;

operatively coupling said complementary output transistor first flow electrode to said clocked half-rail differential logic circuit with single-rail logic OUTBAR terminal;

operatively coupling said complementary output transistor second flow electrode to said fifth transistor first flow electrode;

operatively coupling said complementary output transistor control electrode to said fourth transistor second flow electrode and said clocked half-rail differential logic circuit with single-rail logic OUT terminal.

13. The method for clock control of a clocked half-rail differential logic circuit with single-rail logic of claim 12, wherein;

said base logic portion of said clocked half-rail differential logic circuit with single-rail logic includes logic gates.

14. The method for clock control of a clocked half-rail differential logic circuit with single-rail logic of claim 13, wherein;

said base logic portion of said clocked half-rail differential logic circuit with single-rail logic includes an AND gate.

15. The method for clock control of a clocked half-rail differential logic circuit with single-rail logic of claim 13, wherein;

said base logic portion of said clocked half-rail differential logic circuit with single-rail logic includes an OR gate.

16. The method for clock control of a clocked half-rail differential logic circuit with single-rail logic of claim 13, wherein;

said first supply voltage is Vdd and said second supply voltage is ground.

17. The method for clock control of a clocked half-rail differential logic circuit with single-rail logic of claim 16, wherein;

said first transistor, said second transistor, and said third transistor are PFETs.

18. The method for clock control of a clocked half-rail differential logic circuit with single-rail logic of claim 17, wherein;

said fourth transistor, said fifth transistor, and said complementary output transistor are NFETs.

* * * * *